(12) United States Patent
Mizuki et al.

(10) Patent No.: US 7,948,480 B2
(45) Date of Patent: May 24, 2011

(54) CURRENT DRIVING CIRCUIT

(75) Inventors: Makoto Mizuki, Kyoto (JP); Tetsuro Omori, Osaka (JP); Hiroshi Kojima, Kyoto (JP)

(73) Assignee: Panasonic Corporation, Osaka (JP)

( * ) Notice: Subject to any disclaimer, the term of this patent is extended or adjusted under 35 U.S.C. 154(b) by 1090 days.

(21) Appl. No.: 11/652,607

(22) Filed: Jan. 12, 2007

(65) Prior Publication Data
US 2007/0159418 A1 Jul. 12, 2007

(30) Foreign Application Priority Data

Jan. 12, 2006 (JP) ................................. 2006-004491
Dec. 25, 2006 (JP) ................................. 2006-348015

(51) Int. Cl.
*G09G 5/00* (2006.01)
(52) U.S. Cl. ............ 345/204; 345/76; 345/77; 327/108; 327/538; 327/540
(58) Field of Classification Search .................... 345/76, 345/77, 204; 327/108, 538, 540
See application file for complete search history.

(56) References Cited

U.S. PATENT DOCUMENTS

| 2004/0227499 A1* | 11/2004 | Date et al. ...................... 323/315 |
| 2005/0024352 A1* | 2/2005 | Sano .............................. 345/204 |
| 2005/0104819 A1* | 5/2005 | Shimoda ......................... 345/76 |
| 2005/0259050 A1 | 11/2005 | Fujisawa et al. |

FOREIGN PATENT DOCUMENTS

| JP | 2002-202823 | 7/2002 |
| JP | 2003-288045 | 10/2003 |

* cited by examiner

*Primary Examiner* — Richard Hjerpe
*Assistant Examiner* — Saifeldin Elnafia
(74) *Attorney, Agent, or Firm* — McDermott Will & Emery LLP

(57) ABSTRACT

A current driving circuit includes: a reference input terminal to which a first reference current is given; a current mirror circuit for receiving the first reference current and outputting a first internal current corresponding to the first reference current; a bias voltage generation section for receiving the first internal current and generating a bias voltage corresponding to the first internal current; an output reference current generation section for receiving the bias voltage and generating a second reference current corresponding to the bias voltage; a reference current output terminal for outputting the second reference current; an internal current generation transistor for receiving at a gate thereof the bias voltage and generating a second internal current corresponding to the bias voltage; and an output current generation section for receiving the second internal current and generating n output currents corresponding to the second internal current.

10 Claims, 13 Drawing Sheets

CURRENT DRIVING CIRCUIT

BACKGROUND OF THE INVENTION

1. Field of the Invention

The present invention relates to a current driving circuit for outputting a plurality of output currents corresponding to a reference current.

2. Description of the Prior Art

As loads which need to be operated by constant-current, a LED (light emitting diode) display panel in which a plurality of light emitting diodes are arranged, an organic EL (electro luminescence) display panel in which a plurality of organic EL devices utilizing the electroluminescence phenomenon of an organic compound are arranged, and the like have been known. In such a display panel, a plurality of LEDs or organic ELs are used as light emitting devices and the display panel has a large display area. Therefore, a current driving apparatus for driving a display panel can not be formed of a single current driving circuit (IC). For this reason, in general, a plurality of current driving circuits are used for a single display panel so that driving operation is shared and performed by the plurality of current driving circuits.

FIG. 13 is a block diagram illustrating an exemplary known current driving circuit. The current driving circuit includes two current driving circuits 90 and a reference current supply circuit 91. Each of the current driving circuits 90 includes a reference current input terminal 901, a bias voltage generation transistor 902, n (n is a natural number) driving transistors 903-1 through 903-n and n output current output terminals 904-1 through 904-n. Each of the current driving circuit 90 outputs n output currents Iout-1 through Iout-n each having a current value corresponding to a given reference current Iref. The reference current supply circuit 91 includes PMOS transistors 911, 912-1 and 912-2. The reference current supply circuit 91 supplies the reference current Iref to each of the current driving circuits 90. In FIG. 13, the number of current supply circuits 90 is 2, the reference current supply circuit 91 is formed so as to supply two reference currents.

However, in a conventional technique, only a predetermined number of current driving circuits can be used. Specifically, because a reference current has to be supplied to each current driving circuit, the number of current driving circuits can not be larger than the number of reference currents to be supplied. As described above, the number of current driving circuits to be used is limited depending on a structure of the reference current supply circuit, so that the number of current driving circuits to be used can not be freely changed.

SUMMARY OF THE INVENTION

According to one aspect of the present invention, a current driving circuit includes: a reference current input terminal to which a first reference current is given; a current mirror circuit for receiving, at an input end thereof, the first reference current given to the reference current input terminal and outputting, from an output end thereof, a first internal current corresponding to the first reference current; a bias voltage generation section for receiving the first internal current from the current mirror circuit and generating a bias voltage corresponding to the first internal current; an output reference current generation section for receiving the bias voltage generated by the bias voltage generation section and generating a second reference current corresponding to the bias voltage; a reference current output terminal for outputting the second reference current generated by the output reference current generation section to the outside; an internal current generation transistor for receiving at a gate thereof the bias voltage generated by the bias voltage generation section and generating a second internal current corresponding to the bias voltage; and an output current generation section for receiving the second internal current generated by the internal current generation transistor and generating n output currents corresponding to the second internal current.

With this configuration, current driving circuits can be operated in a chain reaction manner. Accordingly, the number of current driving circuits to be connected can be changed in a simple manner without changing the number of supplied reference currents.

It is preferable that the current driving circuit further includes: a reference voltage node; an operational amplifier; and an adjustment transistor, the reference voltage node receives a reference voltage, a non-inversion input terminal of the operational amplifier is connected to the reference voltage node and an inversion input terminal of the operational amplifier is connected to a source of the adjustment transistor, and the source of the adjustment transistor is connected to the reference current input terminal, a drain of the adjustment transistor is connected to the input end of the current mirror circuit and a gate of the adjustment transistor receives an output of the operational amplifier.

In the current driving circuit, current driving circuits can be connected like a chain without separately and externally providing a reference current supply circuit.

It is preferable that in the bias voltage generation section, a current/voltage conversion coefficient for conversion from the first internal current to the bias voltage is changeable, and in the output reference current generation section, a voltage/current conversion coefficient for conversion from the bias voltage to the second reference current is changeable.

In the current driving circuit, a current value of each of output currents generated in the output current generation section can be controlled by adjusting its current/voltage conversion coefficient. Moreover, a reference current having an appropriate current value can be supplied to a current driving circuit in a subsequent stage by adjusting its voltage/current conversion coefficient.

It is preferable that the output current generation section includes a gate voltage generation section, a gate line, and n driving transistors, the gate voltage generation section receives the second internal current and generates a gate voltage corresponding to the second internal current, one end of the gate line receives the gate voltage generated by the gate voltage generation section and the other end of the gate line is connected to a gate of one of the n driving transistors, each of respective gates of the n driving transistors is connected to the gate line and each of the n driving transistors outputs an output current corresponding to a voltage applied to its own gate, a current/voltage conversion coefficient of the bias voltage generation section is set so that a current value of a first output current output by a first driving transistor of the n driving transistors becomes a desired value, the voltage/current conversion coefficient of the output reference current generation section is set so that the ratio of a current value of the second reference current to a current value of the second output current output by the second driving transistor of the n driving transistors is substantially equal to the ratio of a current value of the first reference current to a current value of the first output current, and a connection point of a gate of the second driving transistor and the gate line is located closer to the other end of the gate line than a connection point of a gate of the first driving transistor and the gate line.

With this configuration, variations in current value of output currents between adjacent current driving circuits can be suppressed. Accordingly, change in current value of the output currents between current driving circuits becomes continuous, so that luminous variations of a display panel are not noticeable.

It is preferable that the current driving circuit further includes a control section for adjusting a current/voltage conversion coefficient of the bias voltage generation section and a voltage/current conversion coefficient of the output reference current generation section.

It is preferable that the current driving circuit further includes a storage section for storing information for the current/voltage conversion coefficient of the bias voltage generation section and the voltage/current conversion coefficient of the output reference current generation section when the current value of the first output current is the desired value and the ratio of the current value of the second reference current to the current value of the second output current is substantially equal to the ratio of the current value of the first reference current to the current value of the first output current and, based on the information stored in the storage section, the control section adjusts the current/voltage conversion coefficient of the bias voltage generation section and the voltage/current conversion coefficient of the output reference current generation section.

In the current driving circuit, control signals do not have to be set every time a current driving circuit is operated.

DESCRIPTION OF THE PREFERRED EMBODIMENTS

Figure 1:
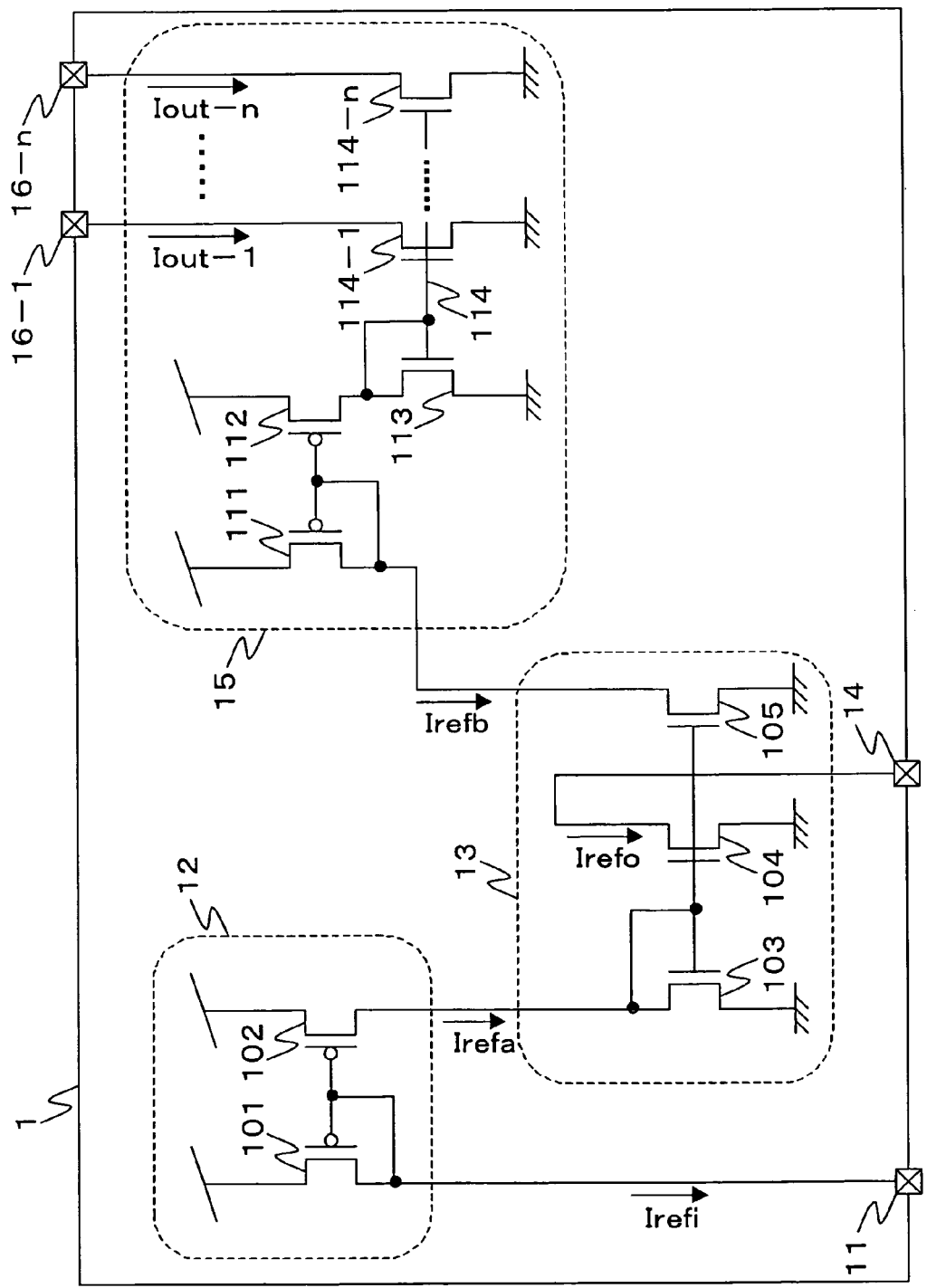
FIG. 1 is a block diagram illustrating a configuration of a current driving circuit according to a first embodiment of the present invention.

Hereafter, embodiments of the present inventions will be described in detail with reference to the accompanying drawings. The same or corresponding elements which appear in the various views of the drawings are identified by the same reference numerals and the description thereof will not be repeated.

First Embodiment

Configuration

FIG. 1 is a block diagram illustrating an overall configuration of a current driving circuit 1 according to a first embodiment of the present invention. The current driving circuit 1 includes a reference current input terminal 11, current mirror circuits 12 and 13, a reference current output terminal 14, an output current generation section 15 and n output current output terminals 16-1 through 16-n. The current driving circuit 1 generates output currents Iout-1 though Iout-n corresponding to a reference current Irefi and an output reference current Irefo corresponding to the reference current Irefi.

The current mirror circuit 12 receives the reference current (first reference current) Irefi from the outside via the reference current input terminal 11 and outputs an internal current (first internal current) Irefa having a current value corresponding to a current value of the reference current Irefi.

The current mirror circuit 12 includes a PMOS transistor 101 for generating a gate voltage corresponding to the current value of the reference current Irefi and a PMOS transistor 102 for receiving the gate voltage generated by the PMOS transistor 101 at a gate thereof.

The current mirror circuit 13 receives an internal current Irefa from the current mirror circuit 12 and outputs an internal reference current (second internal current) Irefb and an output reference current (second reference current) Irefo. The output reference current Irefo is output to the outside via the reference current output terminal 14. Each of respective current values of the internal reference current Irefb and the output reference current Irefo corresponds to the current value of the reference current Irefi.

The current mirror circuit 13 includes a bias voltage generation transistor (bias voltage generation section) 103, an output reference current generation transistor (output reference current generation section) 104 and an internal current generation transistor 105. The bias voltage generation transistor 103 generates a bias voltage having a voltage value corresponding to the current value of the internal current Irefa. The output reference current generation transistor 104 receives the bias voltage generated by the bias voltage generation transistor 103 and outputs the output reference current Irefo having a current value according to a voltage value of a bias voltage. The internal current generation transistor 105 receives the bias voltage generated by the bias voltage generation transistor 103 and outputs the internal reference current Irefb having a current value corresponding to a voltage value of the bias voltage.

The output current generation section 15 receives the internal reference current Irefb from the current mirror circuit 13 and outputs n output currents Iout-1 through Iout-n. The n outputs currents Iout-1 through Iout-n are output to the outside via the output current output terminals 16-1 through 16-n, respectively. Each of respective current values of the n output currents Iout-1 through Iout-n corresponds to the current value of the reference current Irefi.

The output current generation section 15 includes PMOS transistors 111 and 112 which constitute a current mirror circuit, a gate voltage generation transistor 113, a gate line 114 and n driving transistors 114-1 through 114-n. The PMOS transistor 111 receives the internal reference current Irefb and generates a gate voltage having a voltage value corresponding to a current value of the internal reference current Irefb. The PMOS transistor 112 outputs a current having a current value corresponding to the voltage value of the gate voltage generated by the PMOS transistor 111. The gate voltage generation transistor 113 receives the current from the PMOS transistor 112 and generates a gate voltage having a voltage value corresponding to the current value of the internal reference current Irefb. One end of the gate line 114 is connected to a gate of the gate voltage generation transistor 113 and the other end of the gate line 114 is connected to a gate of the driving transistor 114-n. Respective gates of the driving transistors 114-1 through 114-n are connected to the gate line 114 and each of the driving transistors 114-1 through 114-n outputs an output current having a current value corresponding to a voltage received at its gate. Accordingly, n output currents are output.

<Exemplary Connection for Current Driving Circuit>

Figure 2:
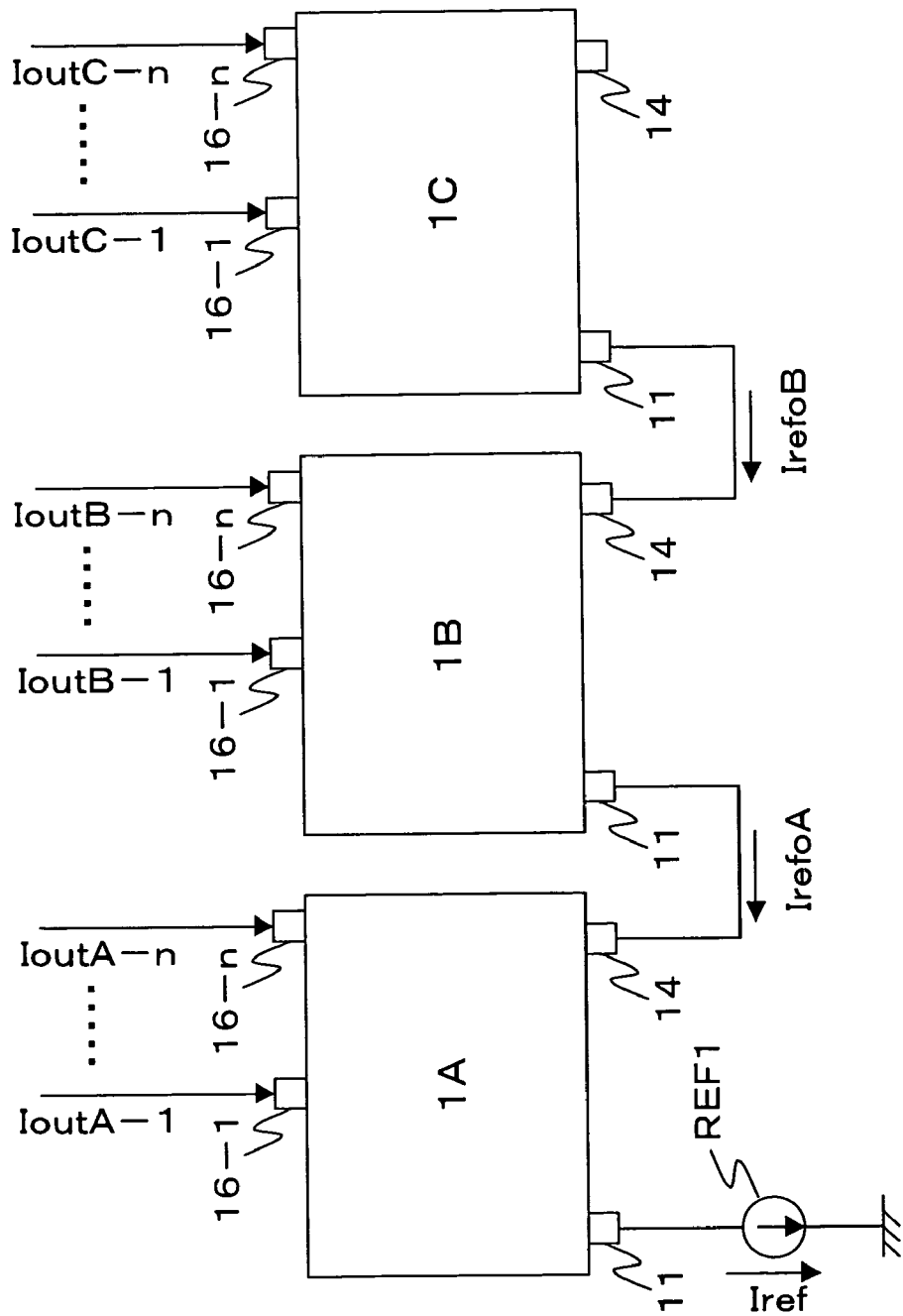
FIG. 2 is a block diagram illustrating an exemplary connection for the current driving circuit of FIG. 1.

FIG. 2 is a block diagram illustrating a large-size current driving apparatus in which current driving circuits 1 of FIG. 1 are connected like a chain. In FIG. 2, the reference numeral 1A denotes a first stage current driving circuit 1, the reference numeral 1B denotes a second stage current driving circuit 1 and the reference numeral 1C denotes a third stage current driving circuit 1. A reference current input terminal 11 of the current driving circuit 1A is connected to a constant current source REF1 for supplying the reference current Iref. A reference current input terminal 11 of the current driving circuit 1B is connected to a reference current output terminal 14 of the current driving circuit 1A in a previous stage of the current driving circuit 1B. A reference current input terminal 11 of the current driving circuit 1C is connected to a reference current output terminal 14 of the current driving circuit 1B in a previous stage of the current driving circuit 1C.

In this embodiment, it is assumed that the output reference current generation transistor 104 generates an output reference current having an equal (or substantially equal) current value to a current value of a reference current given to the reference current output terminal 14.

In the current driving circuit 1A, output currents IoutA-1 through IoutA-n corresponding to the reference current Iref flowing in the reference current input terminal 11 are output to the outside via output current output terminals 16-1 through 16-n, respectively. An output reference current IrefoA having an equal current value to a current value of the reference current Iref is supplied to the reference current input terminal 11 of the current driving circuit 1B via the reference current output terminal 14.

In the current driving circuit 1B, output currents IoutB-1 through IoutB-n corresponding to the output reference current IrefoA flowing in the reference current input terminal 11 are output to the outside via output current terminals 16-1 through 16-n, respectively. An output reference current IrefoB having an equal current value to the current value of the output reference current IrefoA is supplied to the reference current input terminal 11 of the current driving circuit 1C via the reference current output terminal 14.

In the current driving circuit 1C, output currents IoutC-1 through IoutC-n corresponding to the output reference current IrefoB flowing in the reference current input terminal 11 are output to the outside via output current output terminals 16-1 through 16-n, respectively.

In this case, each of respective current values of the output reference currents IrefoA and IrefoB is equal (or substantially equal) to the current value of the reference current Iref. That is, the same reference current (or substantially the same reference current) has given to the current driving circuits 1A, 1B and 1C.

<Effects>

As has been described, current driving circuits can be driven in a chain reaction manner, so that the number of current driving circuits to be connected can be changed in a simple manner without changing the number of supplied reference currents.

Second Embodiment

Configuration

Figure 3:
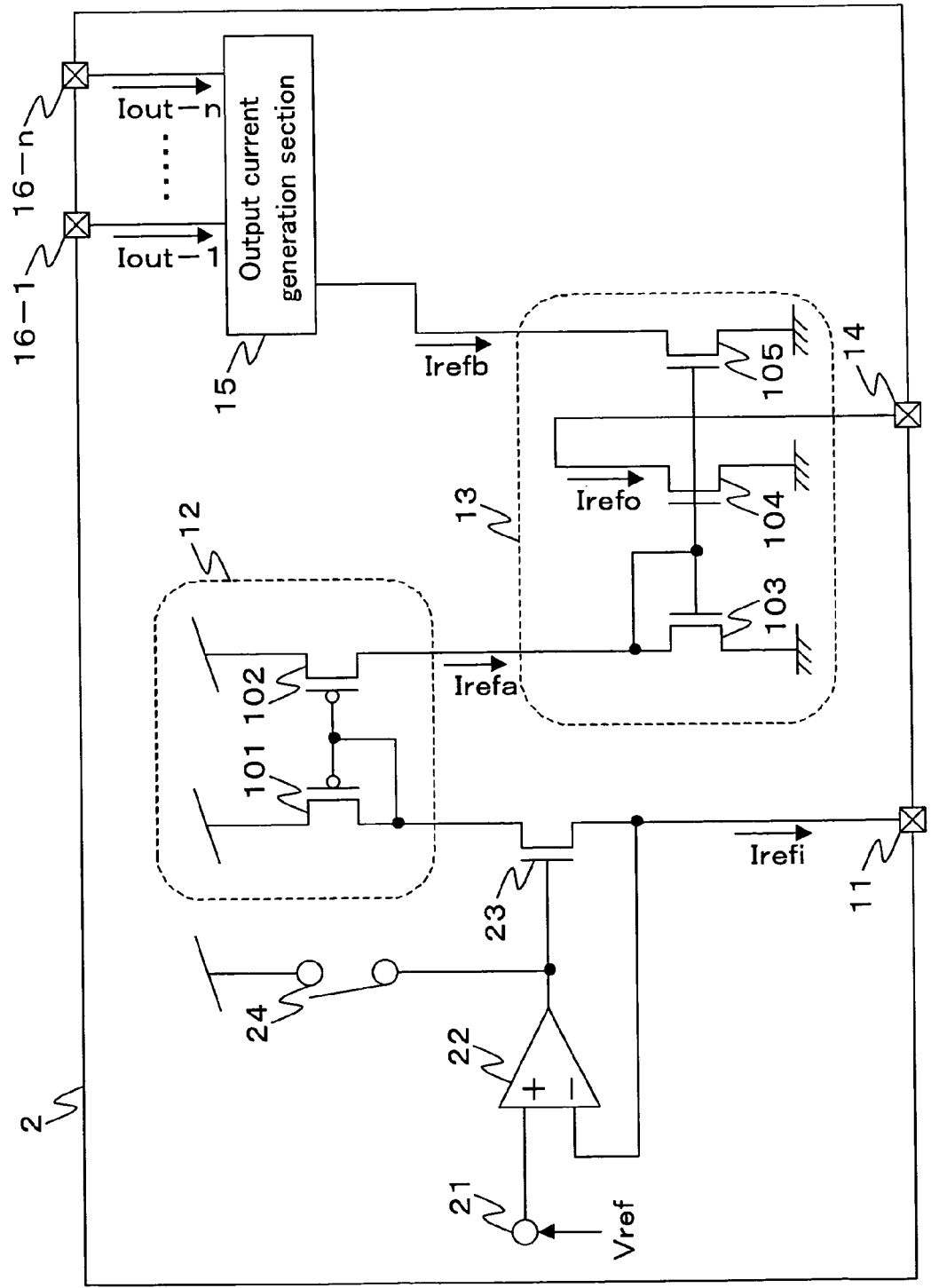
FIG. 3 is a block diagram illustrating a configuration of a current driving circuit according to a second embodiment of the present invention.

FIG. 3 is a block diagram illustrating an overall configuration of a current driving circuit 2 according to a second embodiment of the present invention. The current driving circuit 2 includes, in addition to the current driving circuit 1, a reference voltage node 21, an operational amplifier 22, an adjusting transistor 23 and a switching element 24.

The reference voltage node 21 receives a reference voltage Vref. A non-inversion input terminal of the operational amplifier 22 is connected to the reference voltage node 21, an output terminal of the operational amplifier 22 is connected to a gate of the adjusting transistor 23, and an inversion input terminal is connected to a source of the adjusting transistor 23. An operation state (i.e., an operation state or a halting state) of the operational amplifier 22 is changeable. The adjusting transistor 23 is connected between the reference current input terminal 11 and a drain of the PMOS transistor 101. The switching element 24 can be switched between an ON state and an OFF state and is connected between a power supply source node and the gate of the adjusting transistor 23.

The current driving circuit 2 has two operation modes (i.e., a reference current generation mode and a reference current input mode).

In a reference current generation mode, the operational amplifier 22 is turned to be an operation state and the switching element 24 is turned to be an OFF state. In this case, when the reference current input terminal 11 is connected to a ground node via a resistor (not shown), the reference current Irefi having a current value which is fixed according to a voltage value of the reference voltage Vref given to the reference voltage node 21 and a resistance value of the resistor flows to the ground node via the power supply source node, the current mirror circuit 12 (PMOS transistor 101), the adjusting transistor 23 and the reference current input terminal 11. In the PMOS transistor 102 of the current mirror circuit 12, an internal current Irefa having a current value corresponding to a reference current Irefi flowing in the PMOS transistor 101 flows. Thus, as in the current driving circuit of FIG. 1, the output reference current Irefo, the internal reference current Irefb and output currents Iout-1 through Iout-n are generated.

In a reference current input mode, on the other hand, the operational amplifier 22 is turned to be a halting state and the switching element 24 is turned to be an ON state. Accordingly, an operation state of the adjusting transistor 23 becomes the same state as that of the switching element, which is an ON state (i.e., the adjusting transistor 23 is in a conduction state). In this case, when the reference current Irefi is given to the reference current input terminal 11 from the outside, the reference current Irefi is supplied to the current mirror circuit 12 (PMOS transistor 101) without being influenced by the reference voltage node 21 and the operational amplifier 22, and the internal current Irefa having a current value corresponding to the reference current Irefi flowing in the PMOS transistor 101 flows in the PMOS transistor 102 of the current mirror circuit 12. Accordingly, as in the current driving circuit of FIG. 1, the output reference current Irefo, the internal reference current Irefb and output currents Iout-1 through Iout-n are generated.

<Exemplary Connection for Current Driving Circuit>

Figure 4:
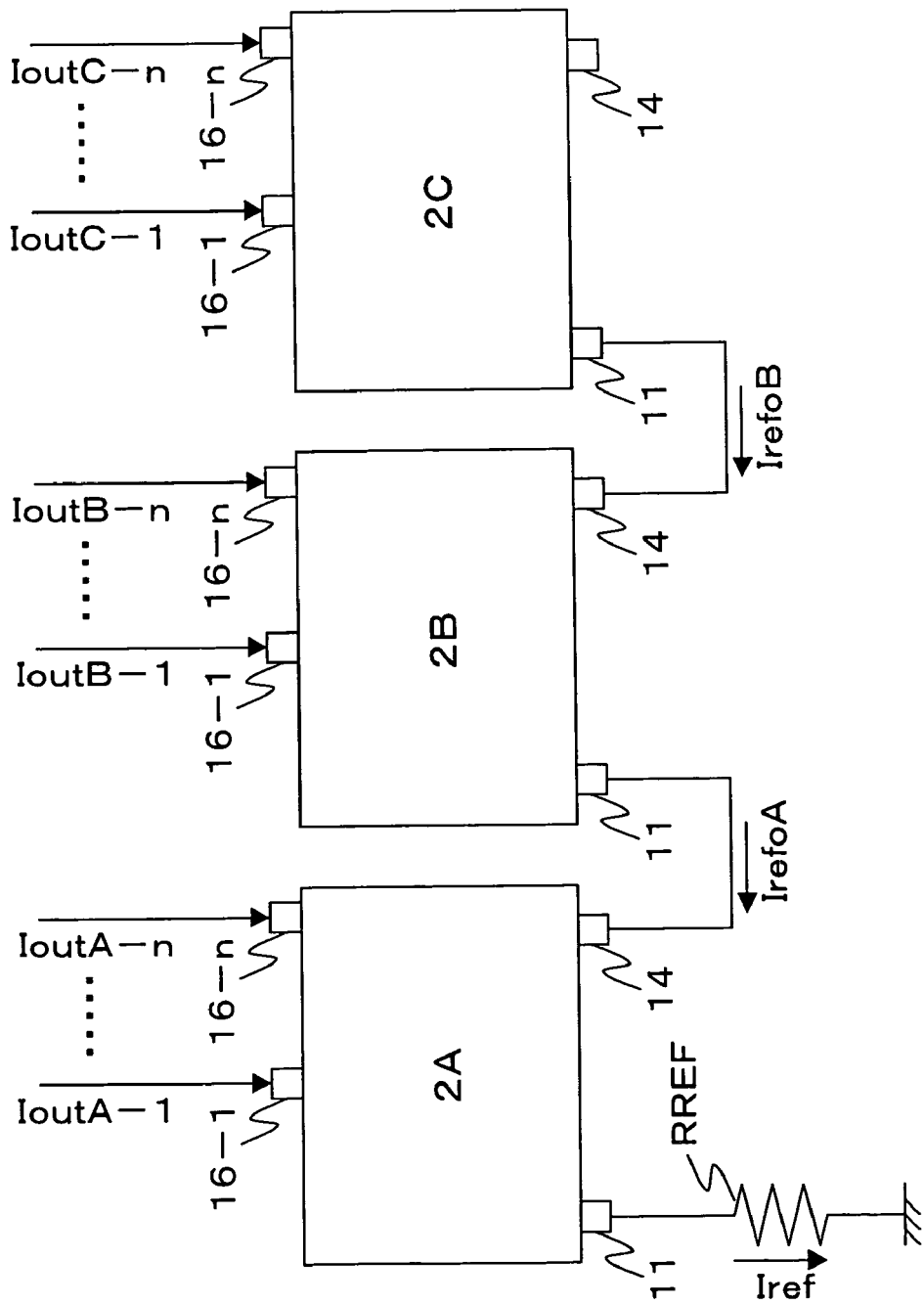
FIG. 4 is a block diagram illustrating an exemplary connection for the current driving circuit of FIG. 3.

FIG. 4 is a block diagram illustrating a large-size current driving apparatus in which current driving circuits 2 of FIG. 3 are linked. In FIG. 4, the reference numeral 2A denotes a current driving circuit 2 in a first stage, the reference numeral 2B denotes a current driving circuit 2 in a second stage and the reference numeral 2C denotes a current driving circuit 2 in a third stage. A reference current input terminal 11 of the current driving circuit 2A is connected to a ground potential via a resistor RREF. The current driving circuits 2B and 2C are connected in the same manner as the current driving circuits 1B and 1C. An operation mode of the current driving circuit 2A is set to be a reference current generation mode and each of respective operation modes of the current driving circuits 2B and 2C is set to be a reference current input mode.

In the current driving circuit 2A, an operational amplifier 22 is in an operation state and a switching element 24 is in an OFF state. Accordingly, in a reference current input terminal 11, the reference current Iref having the current value determined by the reference voltage Vref given to the reference voltage node 21 and the resistance value of the resistor RREF flows. Thus, output currents IoutA-1 through IoutA-n corresponding to the reference current Iref are output to the outside via output current output terminals 16-1 through 16-n, respectively. An output reference current IrefoA having an equal current value to the current value of the reference current Iref is supplied to the reference current input terminal 11 of the current driving circuit 2A via the reference current output terminal 14.

In the current driving circuit 2B, as in the current driving circuit 1A of FIG. 2, output currents IoutB-1 through IoutB-n corresponding to the output reference current IrefoA are output and the output reference current IrefoB having an equal current value to the current value of the output reference current IrefoA is generated.

In the current driving circuit 2C, as in the current driving circuit 1C of FIG. 2, output currents IoutC-1 through IoutC-n corresponding to an output reference current IrefoB are output.

As described above, the same (or substantially the same) reference current as the reference current generated in the current driving circuit 2A is given to the current driving circuits 2B and 2C.

<Effects>

As has been described, with the reference current supply function provided to a current driving circuit, current driving circuits can be connected like a chain without separately and externally providing a reference current supply circuit.

In a current driving circuit set to be in a reference current input mode, an operational amplifier is a halting state, so that unnecessary power consumption can be suppressed.

Third Embodiment

For example, in the configuration of FIG. 2, if there are fabrication variations in characteristics of the current driving circuits 1A, 1B and 1C, a value for the output reference current Irefo generated in each of the current driving circuits 1A, 1B and 1C varies among the current driving circuits 1A, 1B and 1C. The same thing occurs for the internal current Irefa, the internal reference current Irefb and the like. Therefore, even if a current value of an output current is continuously changed in each of the current driving circuits, change in current value of an output current at adjacent part to each of the current driving circuits might be discontinuous. In such a case, luminance variations in a display panel are noticeable at the adjacent part to each of the current driving circuits. Moreover, if an error in the internal reference current Irefb is large, respective values of the output currents Iout-1 through Iout-n might be out of a desired range.

<Configuration>

Figure 5:
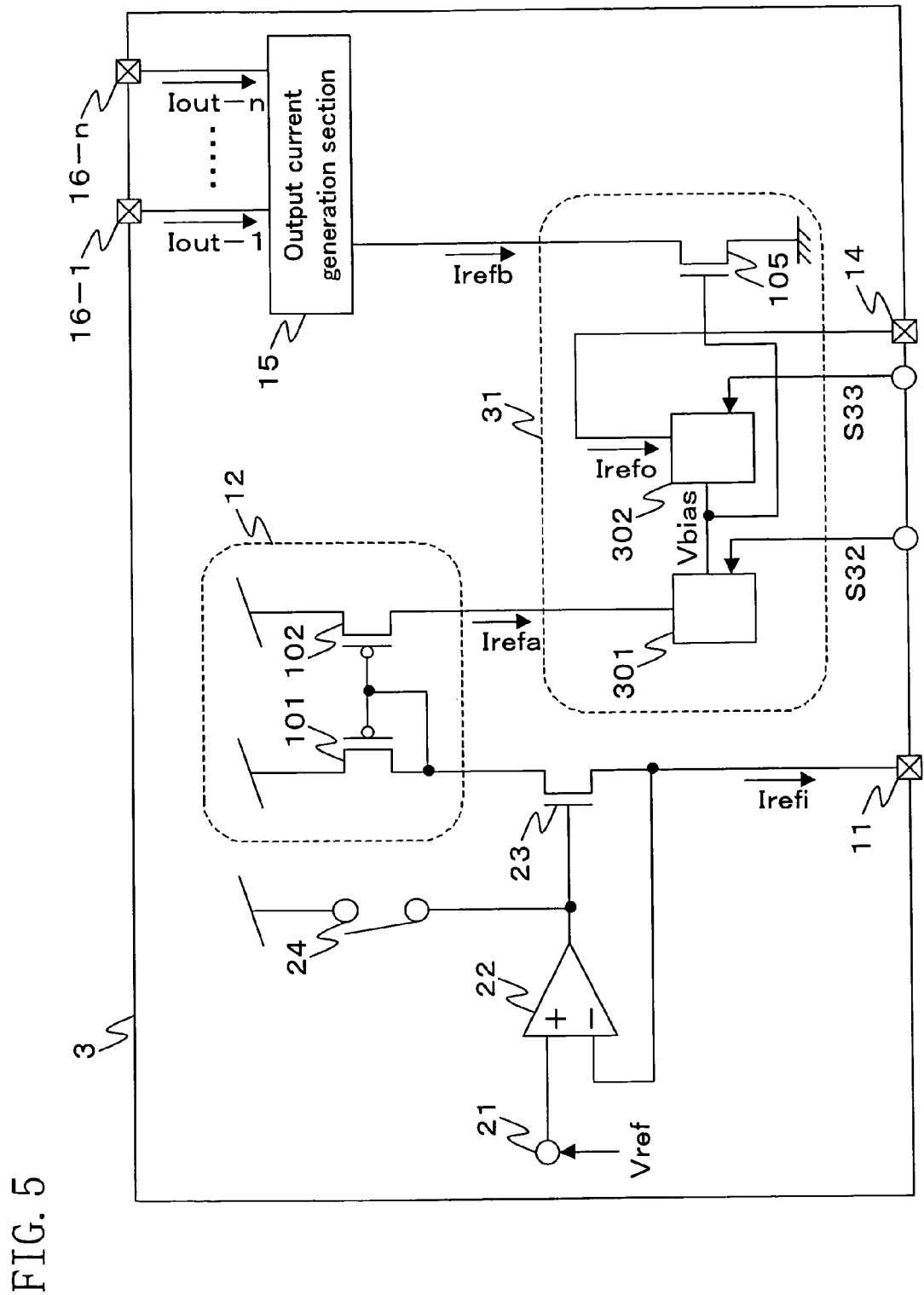
FIG. 5 is a block diagram illustrating a configuration of a current driving circuit according to a third embodiment of the present invention.

FIG. 5 is a block diagram illustrating an overall configuration of a current driving circuit 3 according to a third embodiment of the present invention. The current driving circuit 3 includes a current mirror circuit 31, instead of the current mirror circuit 13 of FIG. 3. The current mirror circuit 31 includes, instead of the bias voltage generation transistor 103 and the output reference current generation transistor 104 of FIG. 3, a bias voltage generation section 301 and an output reference current generation section 302. Other than that, the current driving circuit 3 has the same configuration as that of the current driving circuit 2 of FIG. 3.

The bias voltage generation section 301 generates a bias voltage Vbias having a voltage value corresponding to the current value of the internal current Irefa from the current mirror circuit 12. In the bias voltage generation section 301, the voltage value of the bias voltage Vbias with respect to the current value of the internal current Irefa can be adjusted by a control signal S32. That is, a current/voltage conversion coefficient of the bias voltage generation section 301 can be changed.

The output reference current generation section 302 generates the output reference current Irefo having a current value corresponding to the voltage value of the bias voltage Vbias generated by the bias voltage generation section 301. In the output reference current generation section 302, the current value of the output reference current Irefo with respect to the voltage value of the bias voltage Vbias can be adjusted by a control signal S33. That is, a current/voltage conversion coefficient of the output reference current generation section 302 can be changed.

<Exemplary Configuration of Bias Voltage Generation Section>

Figure 6:
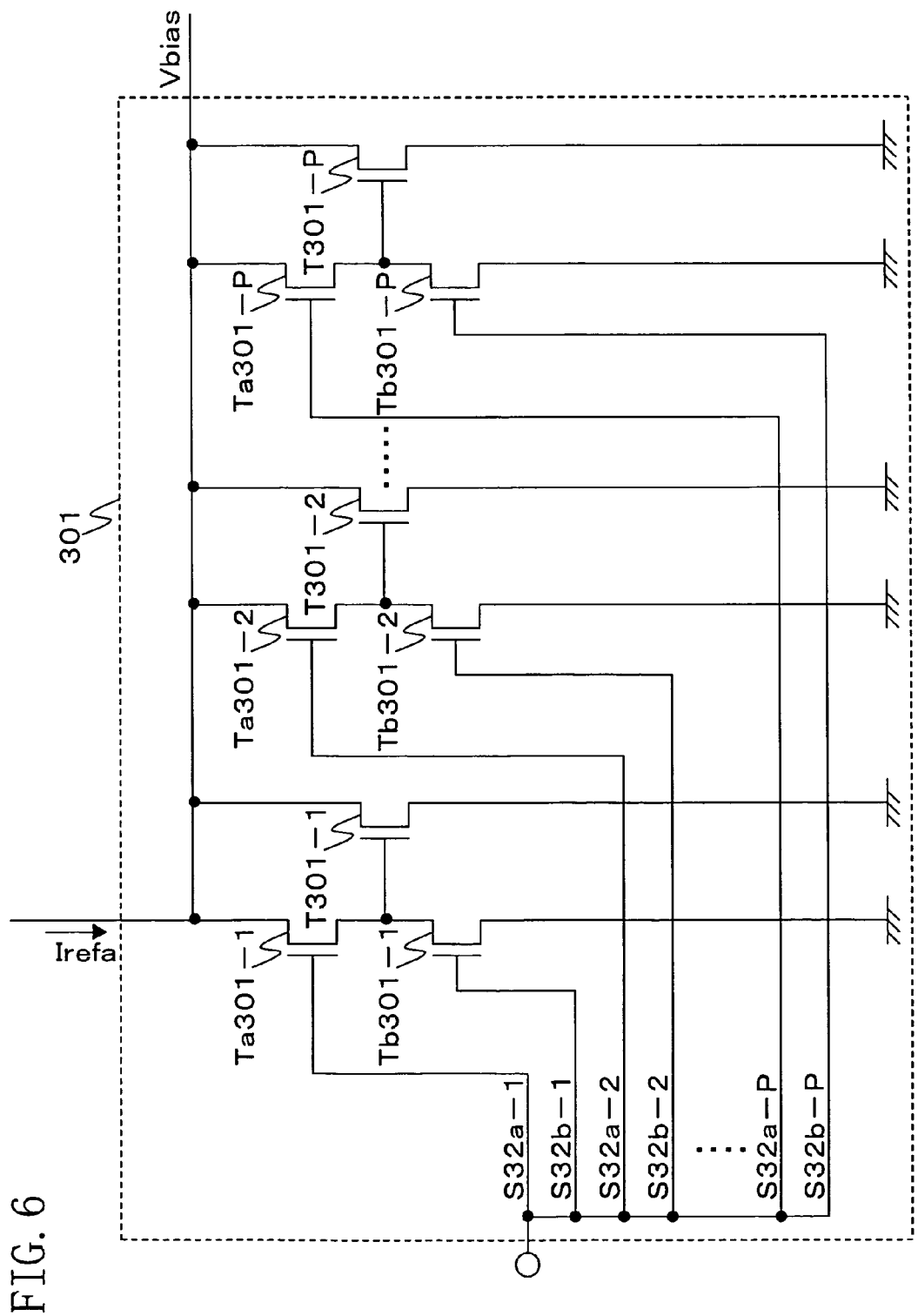
FIG. 6 is a block diagram illustrating an internal configuration of a bias voltage generation section shown in FIG. 5.

FIG. 6 is a block diagram illustrating an internal configuration of the bias voltage generation section 301. The bias voltage generation section 301 includes P (P is a natural number) voltage generation transistors T301-1 through T301-P, P selection transistors Ta301-1 through Ta301-P corresponding to the P voltage generation transistors T301-1 through T301-P and P selection transistors Tb301-1 through Tb301-P corresponding to the P selection transistors Ta301-1 through Ta301-P.

A source of the voltage generation transistor T301-1 is connected to a ground potential and a drain thereof is connected to an output end (i.e., a drain of the PMOS transistor 102) of the current mirror circuit 12. A source of the selection transistor Ta301-1 is connected to a gate of the voltage generation transistor T301-1 which corresponds to the selection transistor Ta301-1 and a drain thereof is connected to a drain of the voltage generation transistor T301-1. A source of the selection transistor Tb301-1 is connected to a ground potential and a drain thereof is connected to a gate of the voltage generation transistor T301-1 which corresponds to the selection transistor Tb301-1. The connection relationship for each of the voltage generation transistors T301-2 through T301-P is the same as that for the voltage generation transistor T301-1. The connection relationship for each of the selection transistors Ta301-2 through Ta301-P is the same as that of the selection transistor Ta301-1. The connection relationship for each of the selection transistors Tb301-2 through Tb301-P is the same as that of the selection transistor Tb301-1.

The control signal S32 includes P control signals S32$a$-1 through S32$a$-P corresponding to the P selection transistors Ta301-1 through Ta301-P, respectively, and P control signals S32$b$-1 through S32$b$-P corresponding to the P selection transistors Tb301-1 through Tb301-P, respectively. The control signals S32$b$-1 through S32$b$-P are inversion signals of the control signals S32$a$-1 through S32$b$-P. The control signals S32$a$-1 through S32$a$-P are supplied to respective gates of the corresponding selection transistors Ta301-1 through Ta301-P, respectively. The control signals S32$b$-1 through S32$b$-P are supplied to respective gates of the corresponding selection transistors Tb301-1 through Tb301-P, respectively.

In the bias voltage generation section 301, when the control signal S32$a$-1 is high level, the control signal S32$b$-1 is low level. Accordingly, the selection transistor Ta301-1 is turned to be an ON state and the selection transistor Tb301-1 is turned to be an OFF state. Thus, the internal current Irefa flows in the voltage generation transistor T301-1 and a gate voltage corresponding to the internal current Irefa is generated at the gate of the voltage generation transistor T301-1. On the other hand, when the control signal S32$a$-1 is low level, the control signal S32$b$-1 is high level. Accordingly, the internal current Irefa does not flow in the voltage generation transistor T301-1. As described above, the voltage value of the bias voltage Vbias generated by the bias voltage generation section 301 can be changed by adjusting the number of voltage generation transistors in which the internal current Irefa flows by the control signal S32.

<Exemplary Configuration of Output Reference Current Generation Section>

Figure 7:
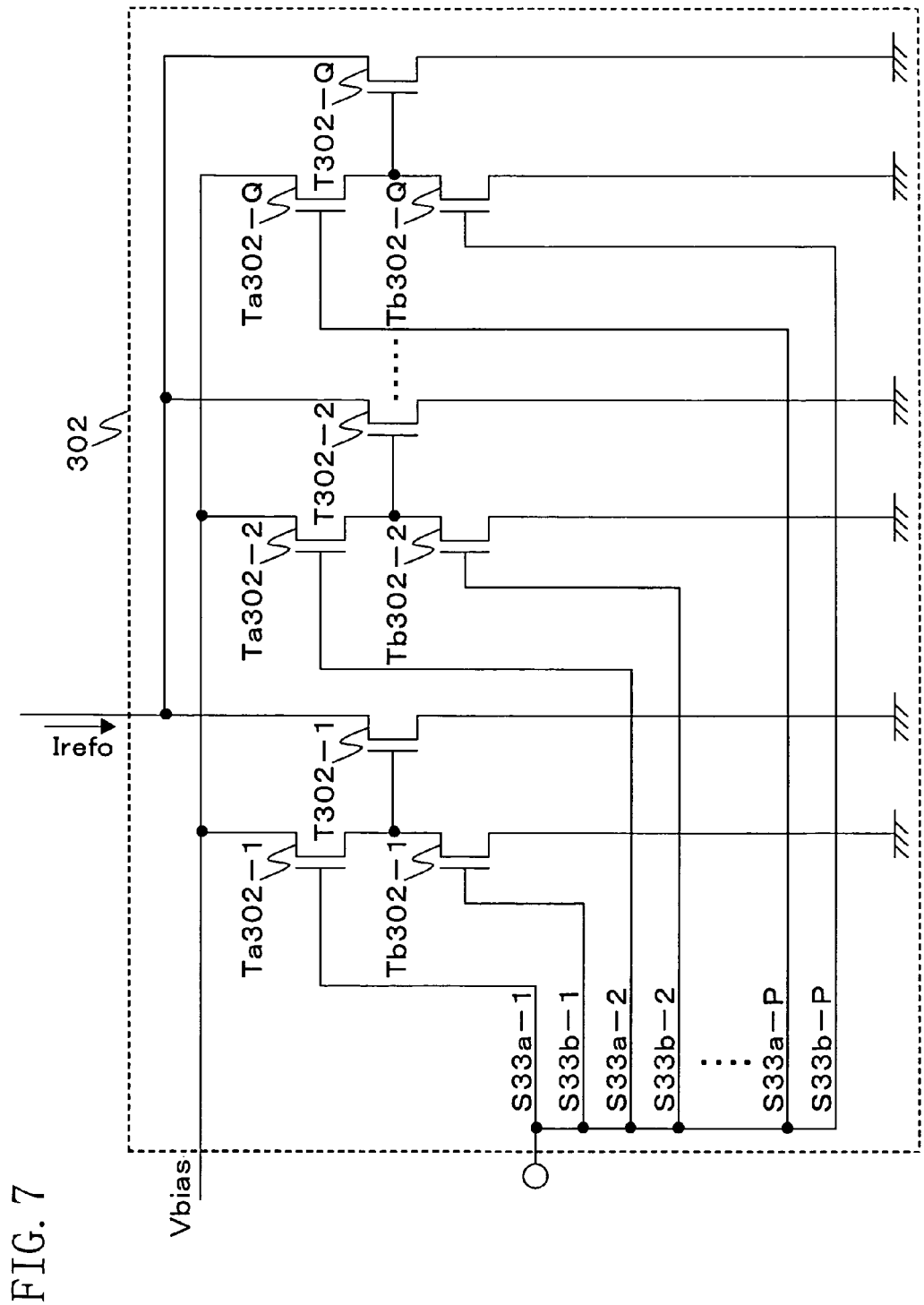
FIG. 7 is a block diagram illustrating an internal configuration of an output reference current generation section shown in FIG. 5.

FIG. 7 is a block diagram illustrating an internal configuration of the output reference current generation section 302. The output reference current generation section 302 includes Q (Q is a natural number) current generation transistors T302-1 through T302-Q, Q selection transistors Ta302-1 through Ta302-Q corresponding to the Q current generation transistors T302-1 through T302-Q and Q selection transistors Tb302-1 through Tb302-Q corresponding to the Q current generation transistors T302-1 through T302-Q.

A source of the current generation transistor T302-1 is connected to a ground potential and a drain thereof is connected to the reference current output terminal 14. A source of the selection transistor Ta302-1 is connected to a gate of the current generation transistor T302-1 which corresponds to the selection transistor Ta302-1. A source of the selection transistor Tb302-1 is connected to a ground potential and a drain thereof is connected to a gate of the current generation transistor T302-1 which corresponds to the selection transistor Tb302-1. The connection relationship for each of current generation transistors T302-2 through T302-Q is the same as that for the current generation transistor T302-1. The connection relationship for each of selection transistors Ta302-2 through Ta302-Q is the same as that for the Ta302-1. The connection relation ship for each of the selection transistors Tb302-2 through Tb302-Q is the same as that for the selection transistor Tb302-1.

The control signal S33 includes Q control signals S33$a$-1 through S33$a$-Q corresponding to the Q selection transistors Ta302-1 through Ta302-Q, respectively, and Q control signals S33$b$-1 through S33$b$-Q corresponding to the Q selection transistors Tb302-1 through Tb302-Q, respectively. The Q control signals S33$b$-1 through S33$b$-Q are inversion signals of the Q control signals S33$a$-1 through S33$a$-Q. The Q control signals S33$a$-1 through S33$a$-Q are supplied to respective gates of the corresponding selection transistors Ta302-1 through Ta302-Q, respectively. The Q control signals S33$b$-1 through S33$b$-Q are supplied to respective gates of the corresponding selection transistors Tb302-1 through Tb302-Q, respectively.

In the output reference current generation section 302, when the control signal S33$a$-1 is high level, the control signal S33$b$-1 is low level. Accordingly, the selection transistor Ta302-1 is turned to be an ON state and the selection transistor Tb302-1 is turned to be an OFF state. Thus, the bias voltage Vbias is supplied to the gate of the current generation transistor T302-1 and a drain current having a current value corresponding to the voltage value of the bias voltage Vbias is generated in the current generation transistor T302. On the other hand, when the control signal S33$a$-1 is low level, the control signal S33$b$-1 is high level. Accordingly, the bias voltage Vbias is not supplied to the gate of the current generation transistor T302-1. As described above, the current value of the output reference current Irefo generated by the output reference current generation section 302 can be changed by adjusting the number of current generation transistors receiving the bias voltage Vbias.

<Adjustment Process>

Figure 8:
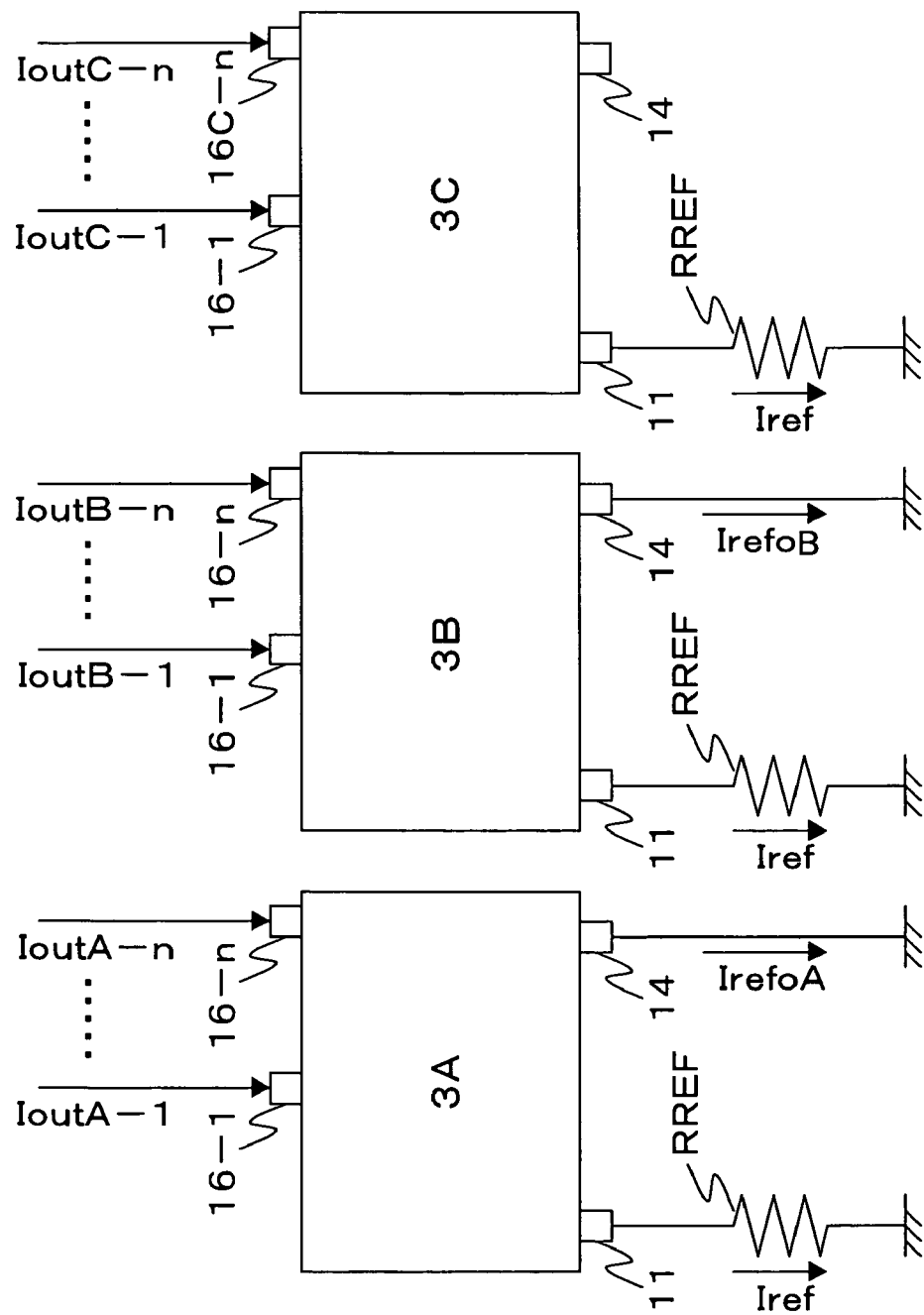
FIG. 8 is a block diagram illustrating adjustment process performed to the current driving circuit of FIG. 5.

Next, adjustment process of a current/voltage conversion coefficient of the bias voltage generation section 301 and a current/voltage conversion coefficient of the output reference current generation section 302 in the current driving circuit 3 will be described with reference to FIG. 8. In FIG. 8, the reference numeral 3A denotes a current driving circuit 3 in a first stage, the reference numeral 3B denotes a current driving circuit 3 in a second stage and the reference numeral 3C denotes a current driving circuit 3 in a third stage. It is assumed that there are fabrication variations in characteristics of the current driving circuits 3A, 3B and 3C. Specifically, even if the same reference current Iref is supplied to each of the current driving circuits 3A, 3B and 3C, respective current values of output currents from the current driving circuits 3A, 3B and 3C, respectively, are not the same. Moreover, it is assumed that respective current values of the output reference currents IrefoA and IrefoB are not the same.

First, each of respective reference current input terminals 11 of the current driving circuits 3A, 3B and 3C is connected to a ground node via a resistor RREF. Each of operation modes of the current driving circuits 3A, 3B and 3C is set to be a reference current generation mode.

Next, in the current driving circuit 3A, the current/voltage conversion coefficient of the bias voltage generation section 301 is adjusted so that the current value of the output current Iout-1 becomes a predetermined target value. The current/voltage conversion coefficient of the output reference current generation section 302 is adjusted so that respective current values of the reference current Iref, the output current Iout-1, the output reference current Irefo and the output current Iout-n have a relationship expressed by Equation A.

$$(Irefi)/(Iout\text{-}1)=(Irefo)/(Iout\text{-}n) \quad \text{[Equation A]}$$

That is, the voltage/current conversion coefficient of the output reference current generation section 302 is adjusted so that the current value of the output reference current Irefo becomes:

$$(Irefo)=(Iout\text{-}n)\cdot(Irefi)/(Iout\text{-}1)$$

In each of the current driving circuits 3B and 3C, adjustment process is performed in the same manner as in the current driving circuit 3A.

Now, the adjustment process will be described in detail. Assume that the reference current Iref given to the current driving circuits 3A, 3B and 3C is 10.0 µA. A target value for an output current is 1.0 µA.

Figure 9A:
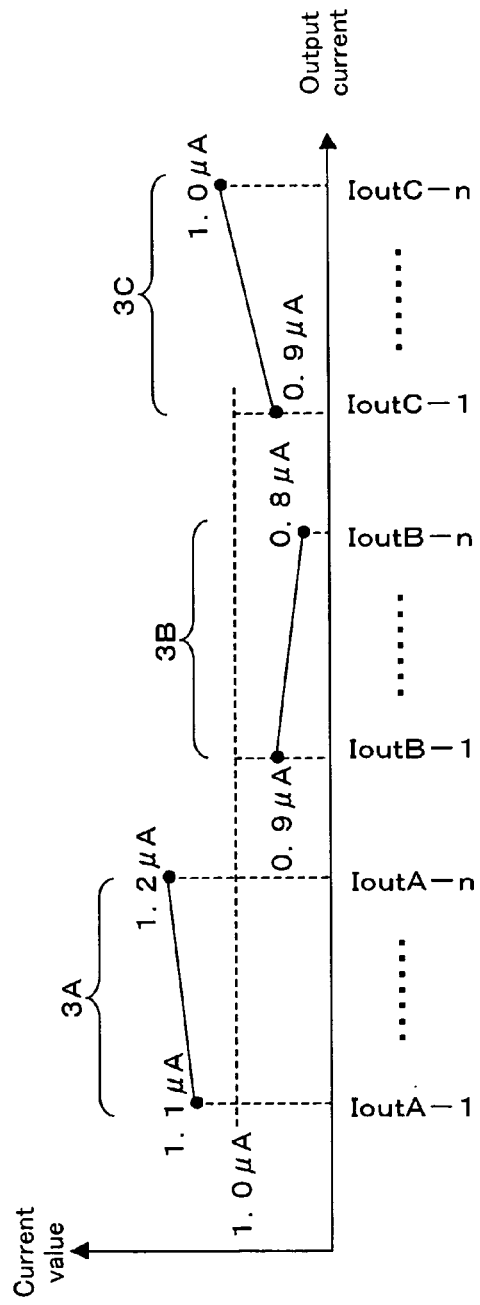
FIG. 9A is a graph showing current values of respective output currents from current driving circuits before adjustment process has not been performed.

As shown in FIG. 9A, before the adjustment process is performed, even with supply of the same reference current to the current driving circuits 3A, 3B and 3C, respective current values of the output currents IoutA-1, IoutB-1 and IoutC-1 are not the same. Change in current value for output current IoutA is continuous. That is, the current value is changed from 1.1 µA to 1.2 µA between the output currents IoutA-1 through IoutA-n. However, change in current value for the output currents IoutB-1 through IoutB-n and change in current value for the output currents IoutC-1 through IoutC-n are different from change in current value for the output currents IoutA-1 through IoutA-n.

Figure 9B:
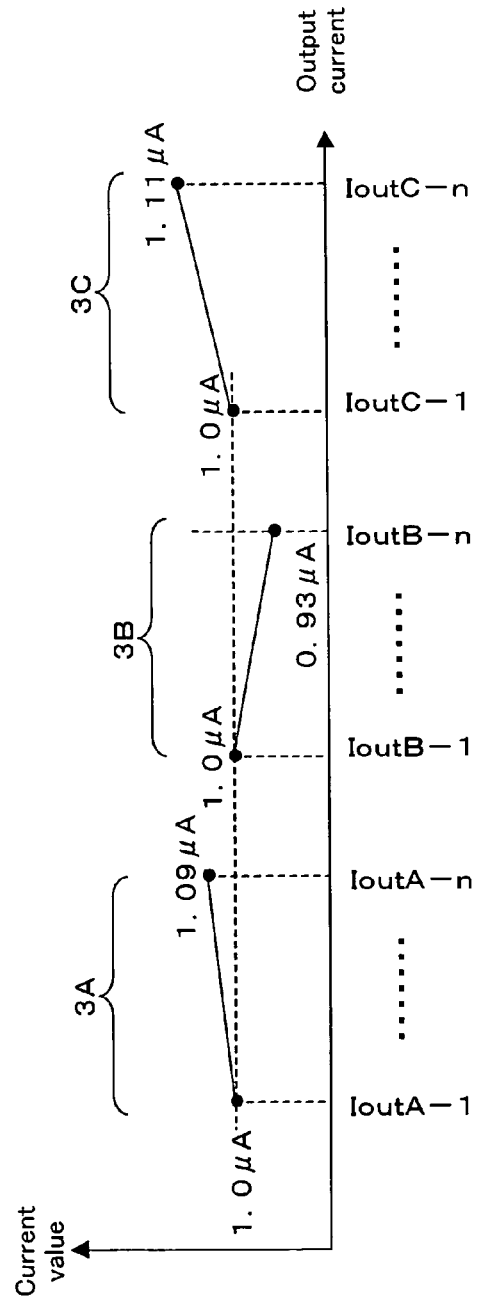
FIG. 9B is a graph showing current values of respective output currents from current driving circuits after adjustment process has been performed.

On the other hand, as shown in FIG. 9B, after the adjustment process has been performed, respective current values of the output currents IoutA-1, IoutB-1 and IoutC-1 are the same (i.e., 1.0 µA). That is, the relationship between each of the output currents IoutA-1, IoutB-1 and IoutC-1 and the reference current Iref is as follows:

$$(IoutA\text{-}1)/(Iref) = (1.0)/(10.0)$$

$$(IoutB\text{-}1)/(Iref) = (1.0)/(10.0)$$

$$(IoutC\text{-}1)/(Iref) = (1.0)/(10.0)$$

Moreover, current values of output reference currents are adjusted, so that respective current values of the output reference currents IrefoA and IrefoB are set to be as follows:

$$(IrefoA) = (IoutA\text{-}n) \cdot (10.0)/(1.0)$$

$$(IrefoB) = (IoutB\text{-}n) \cdot (10.0)/(1.0)$$

$$(IrefoC) = (IoutC\text{-}n) \cdot (10.0)/(1.0)$$

As has been described, in each of the current driving circuits 3A, 3B and 3C, the relationship between a reference current and an output current and the relationship between an output current and an output reference current are adjusted.

<Exemplary Connection for Current Driving Circuit>

Figure 10:
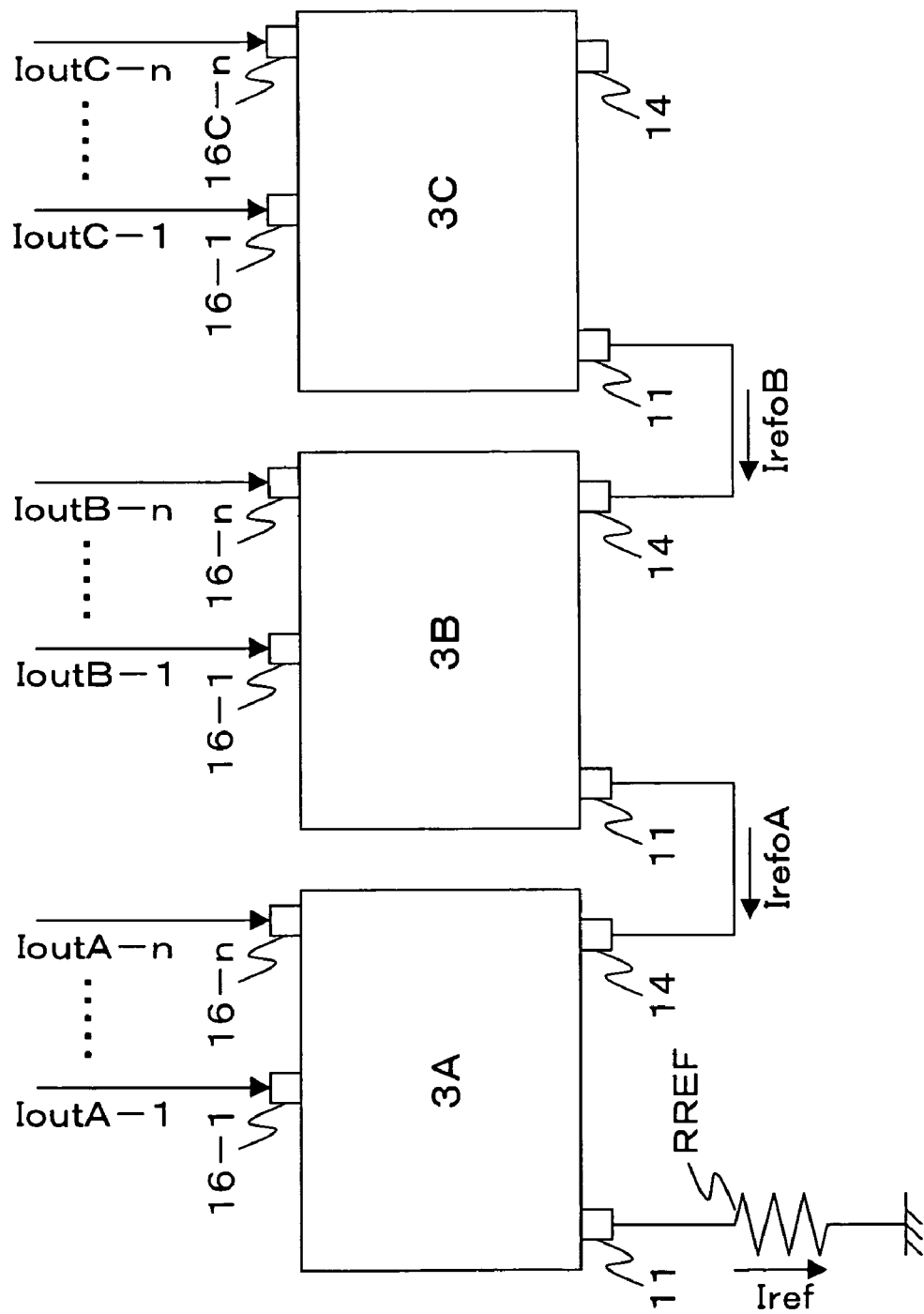
FIG. 10 is a block diagram illustrating an exemplary connection for the current driving circuit of FIG. 8.

FIG. 10 is a block diagram illustrating a large-size current driving apparatus in which the current driving circuits 3A, 3B and 3C of FIG. 8 are connected like a chain. Note that it is assumed that the adjustment process has been performed to each of the current driving circuits 3A, 3B and 3C and the connection relationship and operation mode of each of the current driving circuits 3A, 3B and 3C are the same as those of the current driving circuits 2A, 2B and 2C of FIG. 4.

The current value of the output reference current IrefoA is expressed by the Equation 1 and the current value of the output reference current IrefoB is expressed by the Equation 2.

$$(IrefoA) = (IoutA\text{-}n) \cdot (10.0)/(1.0) \quad \text{[Equation 1]}$$

$$(IrefoB) = (IoutB\text{-}n) \cdot (10.0)/(1.0) \quad \text{[Equation 2]}$$

Moreover, the current value of the output current IoutB-1 is expressed by Equation 3 and the output current of the output current IoutC-1 is expressed by Equation 4.

$$(IoutB\text{-}1) = (IrefoA) \cdot (1.0)/(10.0) \quad \text{[Equation 3]}$$

$$(IoutC\text{-}1) = (IrefoB) \cdot (1.0)/(10.0) \quad \text{[Equation 4]}$$

By replacing (IrefoA) in Equation 3 with Equation 1, (IoutB-1)=(IoutA-n) is obtained.

By replacing (IrefoB) in Equation 4 with Equation 2, (IoutC-1)=(IoutB-n) is obtained.

Figure 11:
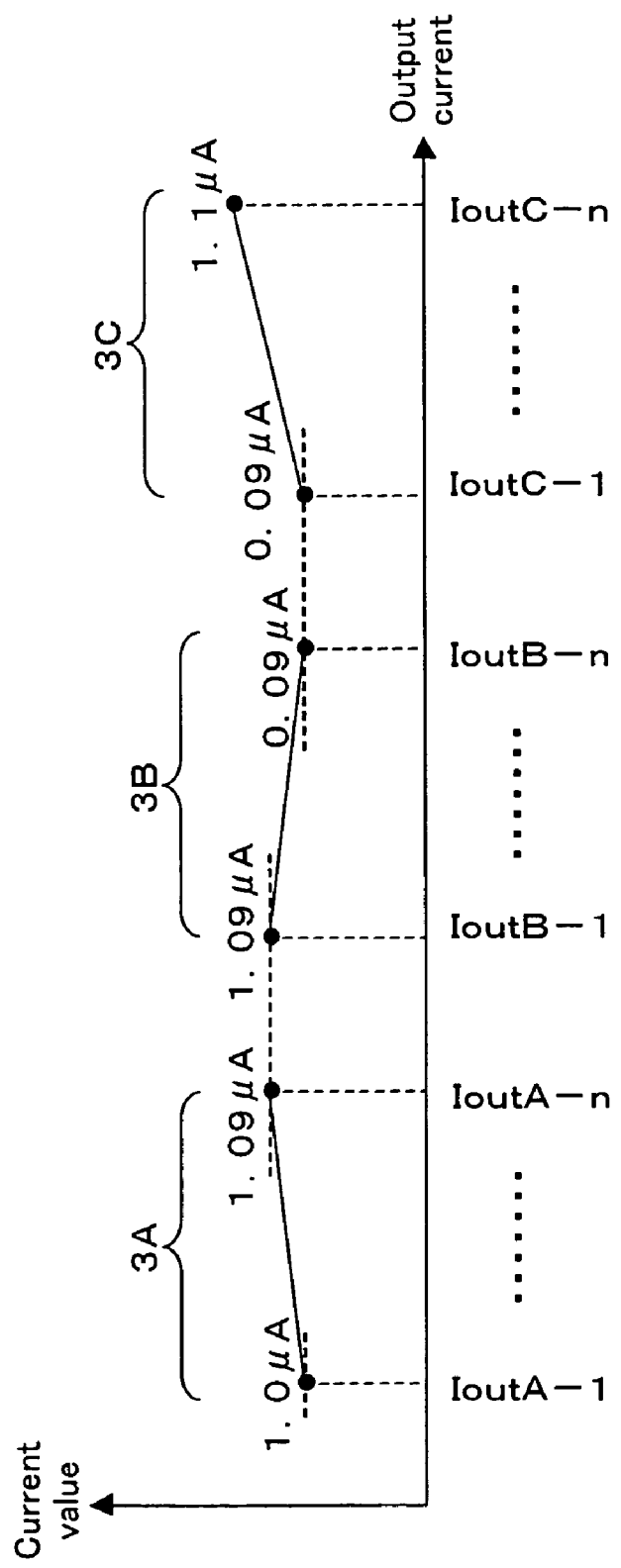
FIG. 11 is a graph showing current values of respective output currents from current driving circuits shown in FIG. 10.

That is, the current value of the output current IoutA-n becomes the same as the current value of the output current IoutB-1 and the current value of the output current IoutB-n becomes the same as the current value of the output current IoutC-1. Accordingly, respective current values of the current driving circuits 3A, 3B and 3C of FIG. 10 vary in the manner shown in FIG. 11.

<Effects>

As has been described, a current value of an output current can be adjusted to be within a desired range by adjusting a current/voltage conversion coefficient of a bias voltage generation section. Moreover, a reference current having an appropriate current value for a current driving circuit in a subsequent stage can be supplied by adjusting a voltage/current conversion coefficient in an output reference current generation section.

Furthermore, variations in current value of output currents between adjacent current driving circuits can be suppressed. That is, discontinuous change in current value of output currents between current driving circuits can be suppressed. Accordingly, change in current value of the output currents between current driving circuits becomes continuous, so that luminous variations of a display panel are not noticeable.

Other Embodiments

Figure 12:
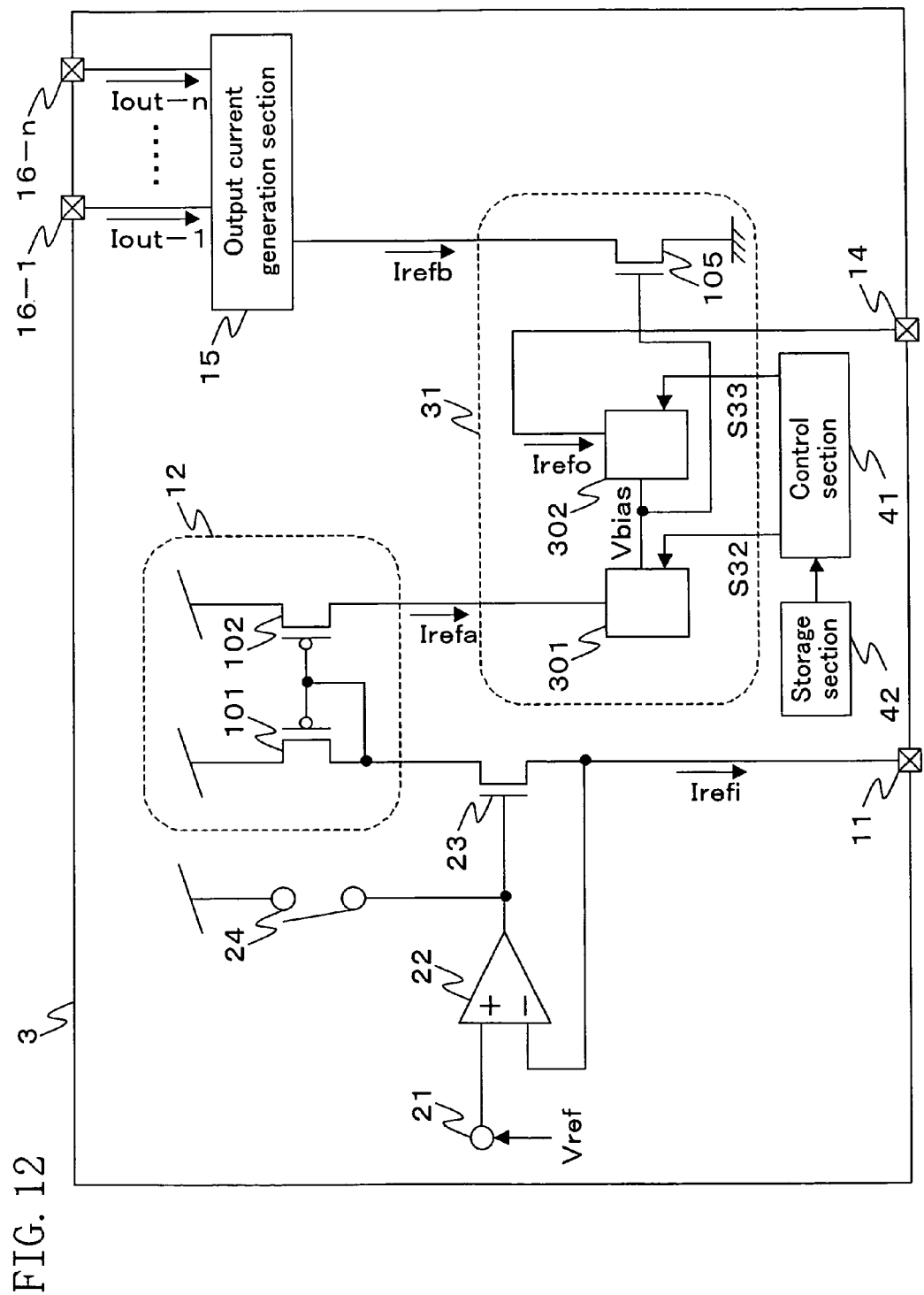
FIG. 12 is a block diagram illustrating a modified example of the current driving circuit of FIG. 5.
Figure 13:
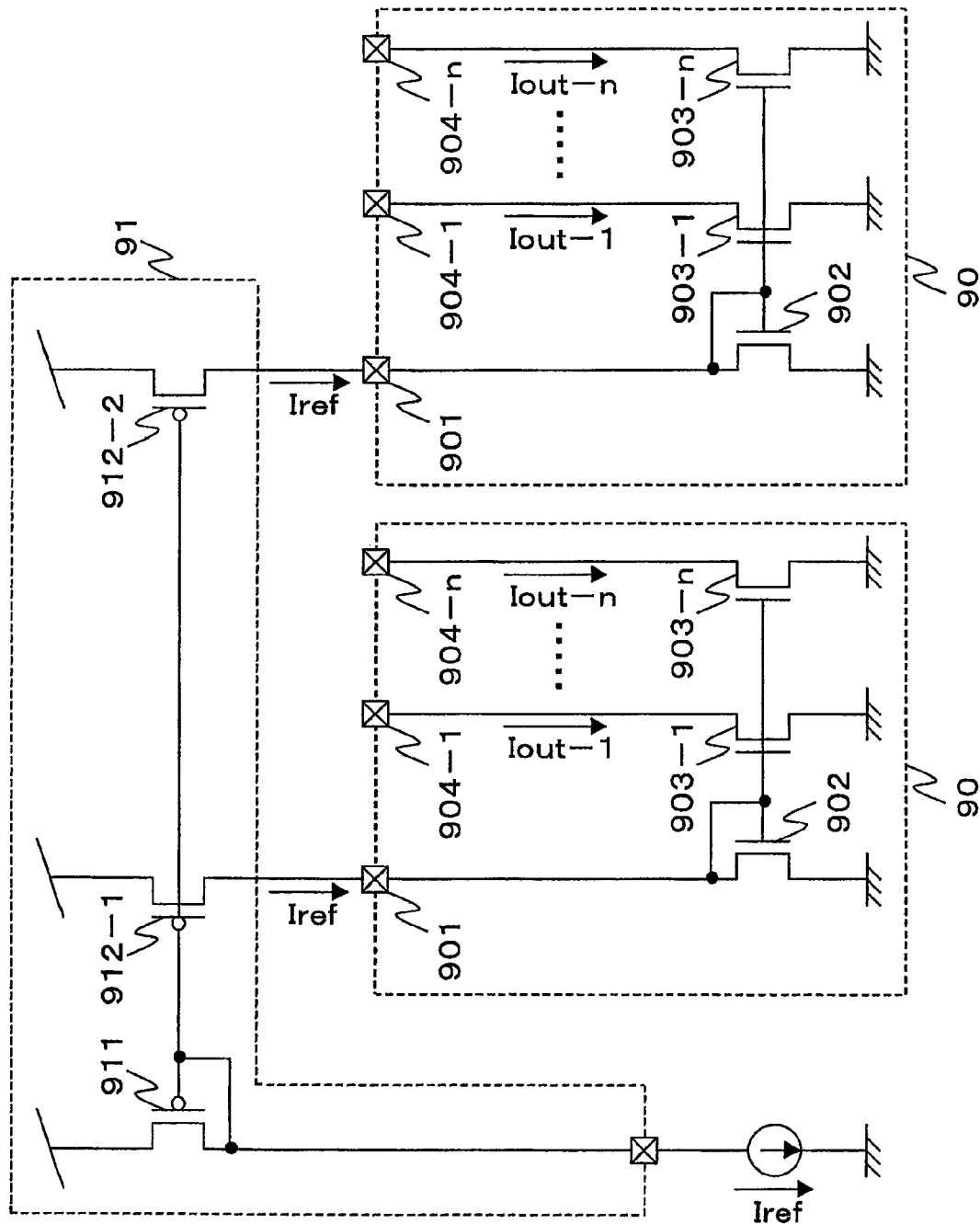
FIG. 13 is a block diagram illustrating a configuration of a known current driving circuit.

As shown in FIG. 12, the current driving circuit 3 may further include a control section 401. The control section 401 increases or reduces the number of ones of the control signals S32a-1 through S32a-n which are high level so that the output current Iout-1 has a desired current value. Moreover, the control section 401 increases or reduces the number of ones of the control signals S33a1 through S33a-n which are high level so that Equation A holds.

The current driving circuit 3 may further include a storage section 402. The storage section 402 stores information for output states of the control signals S32 and S33 where the output current Iout-1 has a desired value and Equation A holds. Based on information stored in the storage section 402, the control section 401 outputs the control signals S32 and S33. With this configuration, control signals do not have to be set every time a current driving circuit is operated.

Furthermore, the storage section 402 may include a plurality of fuses which can be blown by laser trimming. With this configuration, a circuit configuration of the storage section 402 can be changed by executing laser trimming at the time of fabrication/shipping, so that respective output states of the control signals S32 and S33 where each of the output current Iout-1 and the output reference current Irefo has a desired value can be stored.

A current driving circuit according to the present invention is useful as a current driving type display driver such as an organic EL panel or the like. Moreover, a current driving circuit according to the present invention is applicable to a printer driver and the like which includes a plurality of separate circuit blocks and outputs currents with high accuracy while current values of the output currents are adjusted to match each other.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A current driving apparatus comprising:
a plurality of current driving circuits, each of the plurality of current driving circuits including:
a reference current input terminal to which a first reference current is given;
a current mirror circuit for receiving, at an input end thereof, the first reference current given to the reference current input terminal and outputting, from an output end thereof, a first internal current corresponding to the first reference current;
a bias voltage generation section for receiving the first internal current from the current mirror circuit and generating a bias voltage corresponding to the first internal current;
an output reference current generation section for receiving the bias voltage generated by the bias voltage generation section and generating a second reference current corresponding to the bias voltage;
a reference current output terminal for outputting the second reference current generated by the output reference current generation section to the outside;
an internal current generation transistor for receiving at a gate thereof the bias voltage generated by the bias voltage generation section and generating a second internal current corresponding to the bias voltage; and
an output current generation section for receiving the second internal current generated by the internal current generation transistor and generating n output currents corresponding to the second internal current, wherein:
the reference current input terminal of an Mth one of the plurality of current driving circuits is connected to the references current output terminal of an (M−1)th one of the plurality of current driving circuits, where M is an integer equal to or greater than 2,
in the bias voltage generation section, a current/voltage conversion coefficient for conversion from the first internal current to the bias voltage is changeable by a first control signal, and
in the output reference current generation section, a voltage/current conversion coefficient for conversion from the bias voltage to the second reference current is changeable by a second control signal.

2. The current driving apparatus of claim 1, wherein each of the plurality of current driving circuits further includes:
a reference voltage node;
an operational amplifier; and
an adjustment transistor,
wherein the reference voltage node receives a reference voltage,
wherein a non-inversion input terminal of the operational amplifier is connected to the reference voltage node and an inversion input terminal of the operational amplifier is connected to a source of the adjustment transistor, and
wherein the source of the adjustment transistor is connected to the reference current input terminal, a drain of the adjustment transistor is connected to the input end of the current mirror circuit and a gate of the adjustment transistor receives an output of the operational amplify amplifier.

3. The current driving apparatus of claim 2, wherein:
each of the plurality of current driving circuits further includes a switching element for turning to be in an ON state when being in a first mode and turning to be in an OFF state when being in a second mode, the switching element being connected between a power supply source node and a gate of the adjustment transistor, and
an operation state of the operational amplifier can be switched so that the operational amplifier is turned to be an operation state when being in the first mode and turned to be a halting state when being in the second mode.

4. The current driving apparatus of claim 1, wherein the output current generation section includes a gate voltage generation section, a gate line, and n driving transistors,
wherein the gate voltage generation section receives the second internal current and generates a gate voltage corresponding to the second internal current,
wherein one end of the gate line receives the gate voltage generated by the gate voltage generation section and the other end of the gate line is connected to a gate of one of the n driving transistors,
wherein each of respective gates of the n driving transistors is connected to the gate line and each of the n driving transistors outputs an output current corresponding to a voltage applied to its own gate,
wherein a current/voltage conversion coefficient of the bias voltage generation section is set so that when a current value of the first reference current is a predetermined value, a current value of a first output current output by a first driving transistor of the n driving transistors becomes a desired value,
wherein the voltage/current conversion coefficient of the output reference current generation section is set so that the ratio of a current value of the second reference current to a current value of the second output current output by the second driving transistor of the n driving transistors is substantially equal to the ratio of a current value of the first reference current to a current value of the first output current, and
wherein a connection point of a gate of the second driving transistor and the gate line is located closer to the other end of the gate line than a connection point of a gate of the first driving transistor and the gate line.

5. The current driving apparatus of claim 4, wherein a connection point of the gate of the first transistor and the gate line is located at the one end of the gate line or close to the one end of the gate line, and
wherein a connection point of the gate of the second driving transistor and the gate line is located at the other end of the gate line or close to the other end of the gate line.

6. The current driving apparatus of claim 4, wherein each of the plurality of current driving circuits further includes a control section for adjusting a current/voltage conversion coefficient of the bias voltage generation section and a voltage/current conversion coefficient of the output reference current generation section.

7. The current driving apparatus of claim 6, wherein:
each of the plurality of current driving circuits further includes a storage section for storing information for the current/voltage conversion coefficient of the bias voltage generation section and the voltage/current conversion coefficient of the output reference current generation section when the current value of the first output current is the desired value and the ratio of the current value of the second reference current to the current value of the second output current is substantially equal to the ratio of the current value of the first reference current to the current value of the first output current, and
based on the information stored in the storage section, the control section adjusts the current/voltage conversion coefficient of the bias voltage generation section and the voltage/current conversion coefficient of the output reference current generation section.

8. The current deriving apparatus of claim 7, wherein the storage section includes a plurality of fuses which can be blown by laser trimming and stores the information according to states of the fuses with respect to whether the fuses are blown or not.

9. The current driving apparatus of claim 1, wherein:
the bias voltage generation section includes n sections, where n is a natural number, a current terminal for receiving the first internal current and a voltage terminal for outputting the bias voltage,
each of the n sections comprises:
a voltage generation transistor connected at one end to the current terminal and at the other end to a ground potential; and
a first selection transistor and a second selection transistor, the first selection transistor at one end connected to the current terminal and at the other end to the second selection transistor, the second selection transistor at one end connected to the first selection transistor and at the other end to the ground potential,
wherein an output of the first and second selection transistors is connected to a gate of the voltage generation transistor,
the first control signal includes n first selection signals and n second selection signals, and
each of the n first selection signals is coupled to a corresponding first selection transistor in a corresponding one of the n sections, and each of the n second selection signals is coupled to a corresponding second selection transistor in a corresponding one of the n sections.

10. The current driving apparatus of claim 1, wherein:
the output reference current generation section includes n sections, where n is a natural number, a current terminal for outputting the second internal current and a voltage terminal for receiving the bias voltage,
each of the n sections comprises:
a current generation transistor connected at one end to the current terminal and at the other end to a ground potential; and
a first selection transistor and a second selection transistor, the first selection transistor at one end connected to the voltage terminal and at the other end to the second selection transistor, the second selection transistor at one end connected to the first selection transistor and at the other end to the ground potential,
wherein an output of the first and second selection transistors is connected to a gate of the current generation transistor,
the second control signal includes n first selection signals and n second selection signals, and
each of the n first selection signals is coupled to a corresponding first selection transistor in a corresponding one of the n sections, and each of the n second selection signals is coupled to a corresponding second selection transistor in a corresponding one of the n sections.

* * * * *